US009112126B2

(12) United States Patent
Moon et al.

(10) Patent No.: US 9,112,126 B2
(45) Date of Patent: Aug. 18, 2015

(54) LIGHT EMITTING DEVICE PACKAGE, LIGHTING DEVICE INCLUDING THE SAME, AND IMAGE DISPLAY DEVICE

(71) Applicant: LG INNOTEK CO., LTD, Seoul (KR)

(72) Inventors: Sun Mi Moon, Seoul (KR); Gun Kyo Lee, Seoul (KR); Nak Hun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/662,853

(22) Filed: Oct. 29, 2012

(65) Prior Publication Data

US 2013/0105847 A1 May 2, 2013

(30) Foreign Application Priority Data

Oct. 28, 2011 (KR) ........................ 10-2011-0110961

(51) Int. Cl.
*H01L 33/00* (2010.01)
*H01L 33/58* (2010.01)
*G02F 1/1335* (2006.01)
*H01L 33/60* (2010.01)
*H01L 33/62* (2010.01)
H01L 33/64 (2010.01)

(52) U.S. Cl.
CPC .......... *H01L 33/58* (2013.01); *G02F 1/133603* (2013.01); *H01L 33/60* (2013.01); *H01L 33/62* (2013.01); *H01L 33/647* (2013.01); *H01L 2224/48091* (2013.01); *H01L 2924/1815* (2013.01); *H01L 2933/0033* (2013.01)

(58) Field of Classification Search
CPC ........... H01L 2224/48091; H01L 2924/00014; H01L 2924/1815; H01L 2933/0033; H01L 33/58; H01L 33/60; H01L 33/62; H01L 33/647; G02F 1/133603
USPC ................ 257/98, 88, 103, 666, 99, 89, 100; 438/112, 26, 22, 106
See application file for complete search history.

(56) References Cited

U.S. PATENT DOCUMENTS

| | | | |
|---|---|---|---|
| 6,943,433 B2* | 9/2005 | Kamada ........................ 257/666 |
| 2006/0124953 A1* | 6/2006 | Negley et al. .................... 257/99 |
| 2007/0194343 A1* | 8/2007 | Jang et al. ....................... 257/103 |
| 2009/0108281 A1* | 4/2009 | Keller et al. ..................... 257/98 |
| 2010/0193815 A1* | 8/2010 | Jaeger et al. .................... 257/98 |
| 2011/0180833 A1* | 7/2011 | Jang et al. ....................... 257/98 |
| 2011/0220951 A1* | 9/2011 | Kim et al. ....................... 257/98 |
| 2012/0161163 A1* | 6/2012 | Kim ................................. 257/88 |
| 2013/0161665 A1* | 6/2013 | Kuwaharada et al. .......... 257/88 |
| 2014/0008687 A1* | 1/2014 | Jang ................................. 257/98 |
| 2014/0077245 A1* | 3/2014 | Won et al. ....................... 257/98 |

* cited by examiner

*Primary Examiner* — Mohammed Shamsuzzaman
(74) *Attorney, Agent, or Firm* — Ked & Associates, LLP

(57) ABSTRACT

Provided are a light emitting device package, a lighting device, and an image display device. The light emitting device package comprises an electrode layer comprising first and second electrode layers spaced from each other, a recess part in a portion of the first electrode layer, a light emitting device on the recess part of the first electrode layer, a reflective layer on the electrode layer, a resin layer on the light emitting device of the recess part of the first electrode layer, a lens on the resin layer and the reflective layer, an interface coupling layer at least partially contacting the lens, the interface coupling layer being disposed on one surface of the electrode layer, and an insulation layer pattern on the other surface of the electrode layer.

11 Claims, 9 Drawing Sheets

LIGHT EMITTING DEVICE PACKAGE, LIGHTING DEVICE INCLUDING THE SAME, AND IMAGE DISPLAY DEVICE

CROSS-REFERENCE TO RELATED APPLICATIONS

This application claims under 35 U.S.C. §119 to Korean Patent Application No. 10-2011-0110961 (field Oct. 28, 2011) which is hereby incorporated by reference in its entirety.

BACKGROUND

Embodiments relate to a light emitting device package, a lighting device, and an image display device.

Light emitting devices (LEDs), which are semiconductor devices for converting electrical energy into light energy, may emit light of various wavelengths (colors), such as red, green, blue, and ultraviolet rays, by controlling a composition of a semiconductor compound, and generate white light having high efficiency, by using a phosphor or combining colors.

LEDs have advantages such as low power consumption, a semi-permanent life cycle, a fast response time, safety, and environment friendly when compared to typical light sources such as fluorescent lamps and incandescent bulbs. Accordingly, LEDs are being widely used in light emitting diode backlights that replace cold cathode fluorescence lamps (CCFLs) constituting backlights of liquid crystal display (LCD) devices, white light emitting diode lighting devices that replace fluorescent lamps and incandescent lamps, vehicle headlamps, and traffic lights.

In light emitting device packages according to the related art, a light emitting device chip is mounted on a package body, and an electrode layer is disposed on the package body and electrically connected to the light emitting chip. A resin layer including a phosphor is disposed on the light emitting device chip, and a molding part having a predetermined lens shape is disposed on the resin layer.

However, the light emitting device package according to the related art may have a limitation related to reliability when the light emitting device package is operated under a high-temperature high-moisture state.

For example, according to the related art, since an adhesion between the lens molding part and the electrode layer may be weak, the light emitting device package may be vulnerable to moisture introduction. Thus, sealing quality may be deteriorated, and thus the moisture may be penetrated up to a metal layer or a die adhesive of the light emitting device chip to allow the metal layer or the die adhesive to fade, thereby reducing light efficiency.

Also, according to the related art, since the lens molding part has an elastic modulus greater than that of the electrode layer, a thermal stress may occur. In this case, since a structure for preventing the lens molding part from being deformed due to the thermal stress is not provided, the lens molding part may be delaminated to accelerate the penetration of the moisture when the moisture is introduced.

SUMMARY

Embodiments provide a light emitting device package having improved reliability, a backlight unit, and an image display device.

In one embodiment, a light emitting device package comprises: an electrode layer comprising first and second electrode layers spaced from each other; a recess part in a portion of the first electrode layer; a light emitting device on the recess part of the first electrode layer; a reflective layer on the electrode layer; a resin layer on the light emitting device of the recess part of the first electrode layer; a lens on the resin layer and the reflective layer; an interface coupling layer at least partially contacting the lens, the interface coupling layer being disposed on one surface of the electrode layer; and an insulation layer pattern on the other surface of the electrode layer.

In another embodiment, a lighting device comprises: a bottom cover; a light emitting module on the bottom cover; and an optical member on the light emitting module, wherein the light emitting module comprises: a board on the bottom cover; and the light emitting device package according to claim 1, the light emitting device package being disposed on the board.

In further another embodiment, an image display device comprises: a bottom cover; a light emitting module on the bottom cover; an optical member on the light emitting module; and a display panel on the optical member, wherein the light emitting module comprises: a board on the bottom cover; and the light emitting device package according to claim 1, the light emitting device package being disposed on the board.

The details of one or more embodiments are set forth in the accompanying drawings and the description below. Other features will be apparent from the description and drawings, and from the claims.

DETAILED DESCRIPTION OF THE EMBODIMENTS

Figure 1:
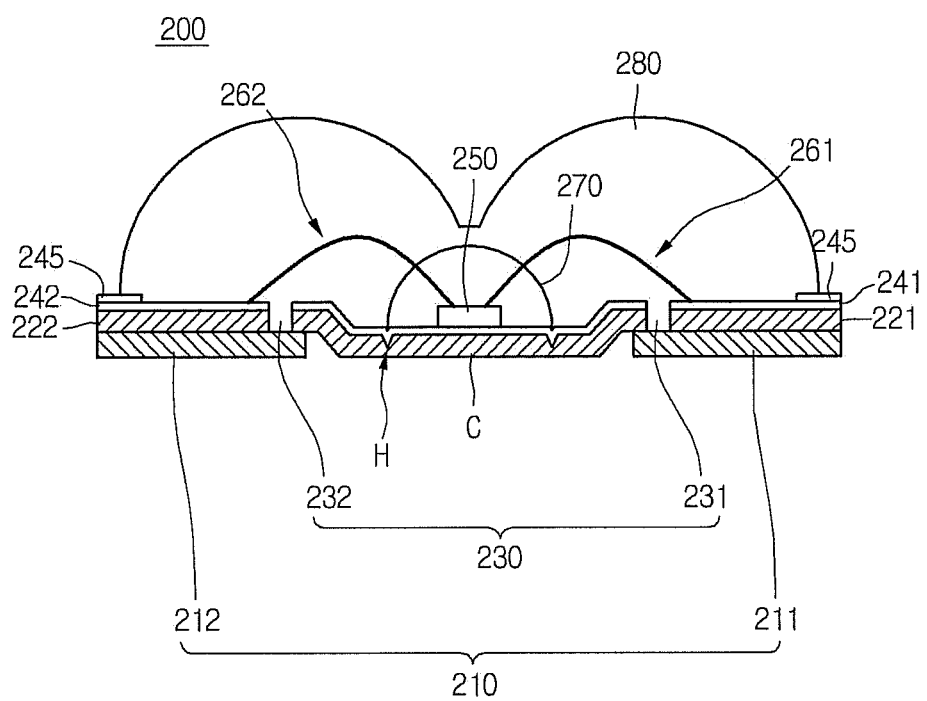
FIG. 1 is a sectional view of a light emitting device package according to a first embodiment.

Hereinafter, a light emitting device package, a lighting device, and an image display device according to embodiments will be described with reference to accompanying drawings. Moreover, in various sectional views of the light emitting device, background objects which may be positioned beyond the sectional line are not shown merely for ease of discussion. For example, the sectional view of FIG. 1 is a view along line I-I' in FIG. 2. However, merely for ease of discussion, background objects beyond line I-I' are not shown in FIG. 1.

In the description of embodiments, it will be understood that when a layer (or film) is referred to as being 'on/over' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiments)

Figure 2:
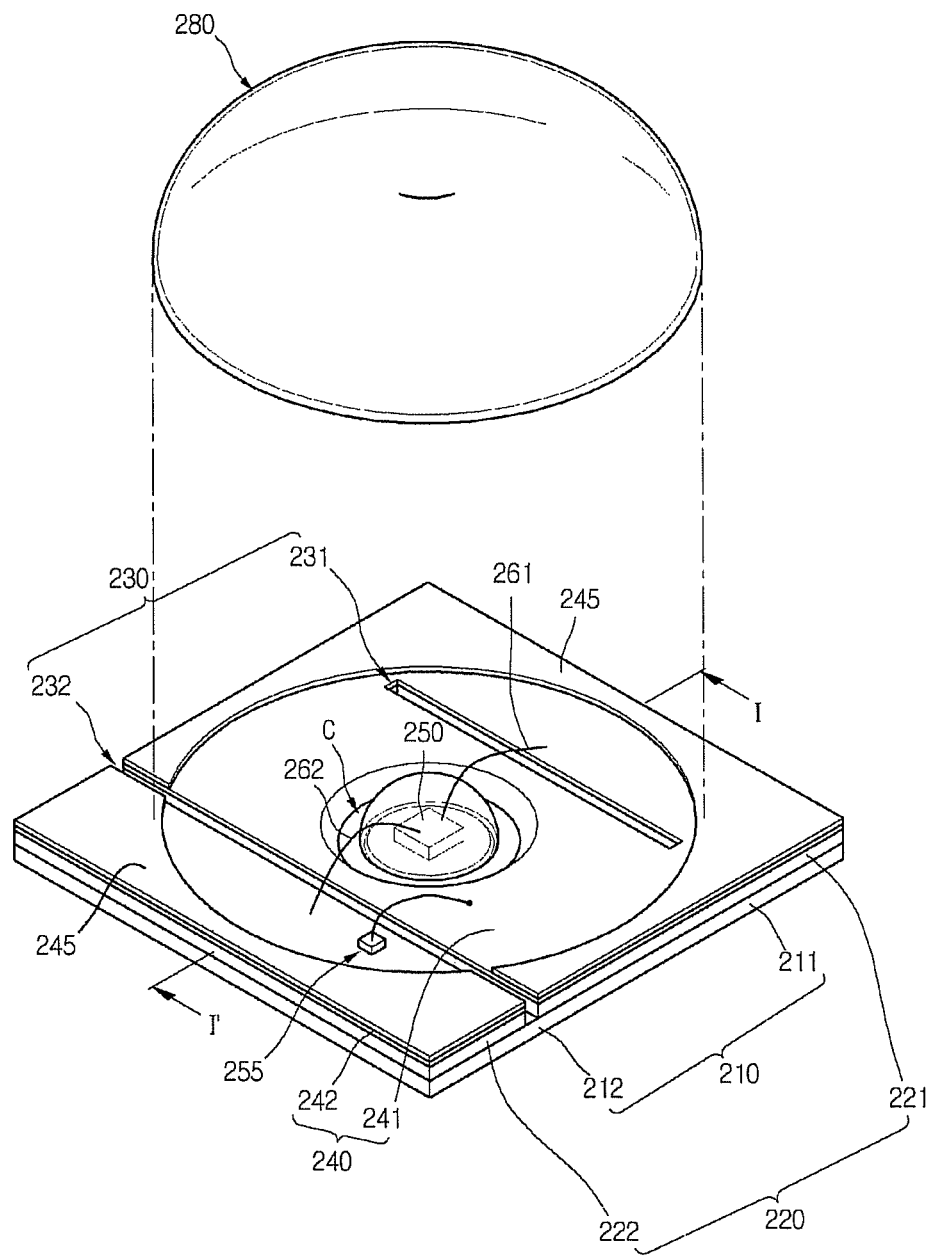
FIG. 2 is an exploded perspective view of the light emitting device package according to the first embodiment.

FIG. 1 is a sectional view of a light emitting device package 200 according to a first embodiment. FIG. 2 is an exploded perspective view of the light emitting device package 200 according to the first embodiment.

The light emitting device package 200 according to the current embodiments may include an electrode layer 220 including a first electrode layer 221 and a second electrode layer 222 which are spaced from each other, a recess part C disposed on a portion of the first electrode layer 221, a light emitting device 250 disposed on the recess part C of the first electrode layer, a reflective layer 240 disposed on the electrode layer 220, a resin layer 270 including a phosphor on the light emitting device 250 disposed on the recess part C of the first electrode layer 221, a lens 280 above the resin layer 270 and the reflective layer 220, an interface coupling layer 245 contacting at least one portion of the lens 280 and disposed on one surface of the electrode layer 220, and an insulation layer pattern 210 disposed on the other surface of the electrode layer 220. The light emitting device 250 may be a light emitting diode (LED) chip 250, but is not limited thereto.

The interface coupling layer 245 may be a polymer passivation layer. For example, the interface coupling layer 245 may include a solder resist, but is not limited thereto. For example, the interface coupling layer 245 may include a photo solder resist (PSR) or a white solder resist, but is not limited thereto.

The recess part C of the first electrode layer 221 may be a down-set area or a bent part area with respect to a portion of the first electrode layer 221, but is not limited thereto.

According to the current embodiment, the electrode layer 220 may be down-set to form the recess part C, and then the LED chip 250 may be mounted on the recess part C to improve structural stability.

Also, according to the current embodiment, the LED chip 250 may be mounted on the recess part C after the recess part C is disposed on the electrode layer 220, and then the resin layer 270 including the phosphor may be disposed. Thus, when an encapsulation including a phosphor is formed, the encapsulation may be manufactured in a doom shape to produce a uniform color temperature, thereby improving a color variation.

For example, according to the current embodiment, the phosphor may be dotted on the LED chip 250 to reduce an area of the phosphor when compared to an existing method in which a phosphor is filled into a cup. Thus, the color vibration may be reduced to reduce an occurrence of irregular colors and also to reduce a thickness of a set.

Also, according to the current embodiment, since the LED chip 250 is mounted after the recess part C is disposed on the electrode layer 220, a position on which the LED chip 250 is seated may be lowered to reduce a height of a wire when a wire bonding process is performed. Thus, a thermal stress may be minimized to improve a yellow ring phenomenon due to the thermal stress.

Also, in the current embodiment, since a groove H is defined in the recess part C of the first electrode layer 221 on an outer circumference of the resin layer 270, the resin layer 270 may be manufactured in the dome shape to reduce the color vibration. Here, the phosphor may be coated in a flat shape, but a doom shape, through a conformal coating process.

In the current embodiment, the first electrode layer 221 and the second electrode layer 222 may be electrically separated from each other by an electrode separation part 232. Also, a symmetrical opening 231 having a shape equal or similar to that of the electrode separation part 232 may be defined in the first electrode layer 221 at a position symmetrical to that of the electrode separation part 232 to provide stability against the thermal stress and improve light uniformity. The electrode separation part 232 and the symmetrical opening 231 may constitute a separation part 230.

The LED chip 250 may be mounted after a die adhesive (not shown) such as silicon epoxy is disposed on a mounting area of the recess part C.

The LED chip 250 may be electrically connected to the reflective layer 240 by the wire. For example, the LED chip 250 may be electrically connected to a first reflective layer 241 by a first wire 261 and electrically connected to a second reflective layer 242 by a second wire 262.

Embodiments may provide a light emitting device package having improved reliability, a backlight unit, and an image display device.

Thus, according to embodiments, the interface coupling layer 245 may be disposed under an outer circumference of the lens 280 to increase a coupling force between the lens 240 and the reflective layer 240, thereby sealing quality on a side portion of the lens 280 and preventing moisture from being penetrated. Thus, since it may prevent the electrode 220 or the die adhesive from fading to increase light efficiency, a light emitting device package having improved reliability, a backlight unit, and an image display device may be provided.

Also, according to embodiments, the interface coupling layer 245 disposed under the outer circumference of the lens 280 may prevent the lens 280 from being deformed by the thermal stress to prevent the lens 280 from being delaminated and reinforce sealing quality against the moisture penetration. Thus, a light emitting device package having improved reliability, a backlight unit, and an image display device may be provided.

Thus, according to embodiments, since the reliability may be improved, a light emitting device having improved light efficiency, a backlight unit, and an image display device may be provided.

In the first embodiment, the interface coupling layer 245 may be disposed between the reflective layer 240 and the lens 280.

Alternatively, the interface coupling layer 245 may be disposed between the electrode layer 220 and the lens 280. The reflective layer 240 may be disposed on at least one portion between the interface coupling layer 245 and the electrode layer 220.

For example, the interface coupling layer 245 may be disposed on the outer circumference of the electrode layer 220. Also, an inner profile of the interface coupling layer 245 may have a circular shape corresponding to that of the lens 280, but is not limited thereto. At least one portion of the interface coupling layer 245 may vertically overlap and contact the lens 280 on the outer circumference of the lens 280.

At least one portion of a lower portion of the outer circumference of the lens 280 may overlap the interface coupling layer 245. Thus, the outer circumference of the lens 280 may have a diameter greater than an inner diameter of the interface coupling layer 245, but is not limited thereto.

According to embodiments, the interface coupling layer 245 may be disposed around an outer circumference of the reflective layer 240 and under the outer circumference of the lens 280 to increase a coupling force between the lens 280 and the reflective layer 240 and reinforce sealing quality on a side portion of the lens 280, thereby preventing moisture from being penetrated and improving light efficiency. Thus, a light emitting device package having improved reliability, a backlight unit, and an image display device may be provided.

Also, according to embodiments, the interface coupling layer 245 disposed around the outer circumference of the reflective layer 240 and under the outer circumference of the lens 280 may prevent the lens 280 from being delaminated to reinforce sealing quality against the moisture penetration. Thus, a light emitting device package having improved reliability, a backlight unit, and an image display device may be provided.

Figure 3:
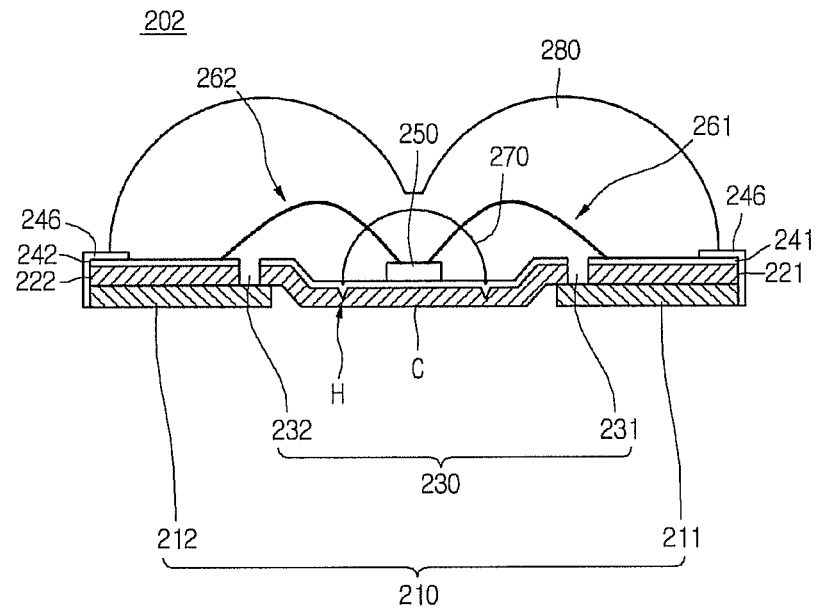
FIG. 3 is a sectional view of a light emitting device package according to a second embodiment.

FIG. 3 is a sectional view of a light emitting device package 202 according to a second embodiment.

The second embodiment may adopt technical properties of the first embodiment.

In the second embodiment, an interface coupling layer 246 may be disposed between the reflective layer 240 and the lens 280 and between the reflective layer 240 and the insulation layer pattern 210.

Also, the interface coupling layer 246 may be disposed between the reflective layer 240 and the lens 280 and at least one side surface of the electrode layer 220 and the reflective layer 240.

According to the second embodiment, the interface coupling layer 246 may be disposed between the reflective layer 240 and the lens 280 and side surfaces of the reflective layer 240 and the insulation layer pattern 210 to intercept a moisture penetration path of a side surface of the outer circumference of the lens 280 and increase a coupling force between the lens 280 and the reflective layer 240. Thus, sealing quality on a side portion of the lens 280 may be reinforced to prevent moisture from being penetrated, thereby increasing light efficiency. Therefore, a light emitting device package having improved reliability, a backlight unit, and an image display device may be provided.

Also, according to embodiments, the interface coupling layer 246 may be disposed between the reflective layer 240 and the lens 280 and the side surfaces of the reflective layer 240 and the insulation layer pattern 210 to prevent the lens 280 from being delaminated and reinforce sealing quality against the moisture penetration. Thus, a light emitting device package having improved reliability, a backlight unit, and an image display device may be provided.

Figure 4:
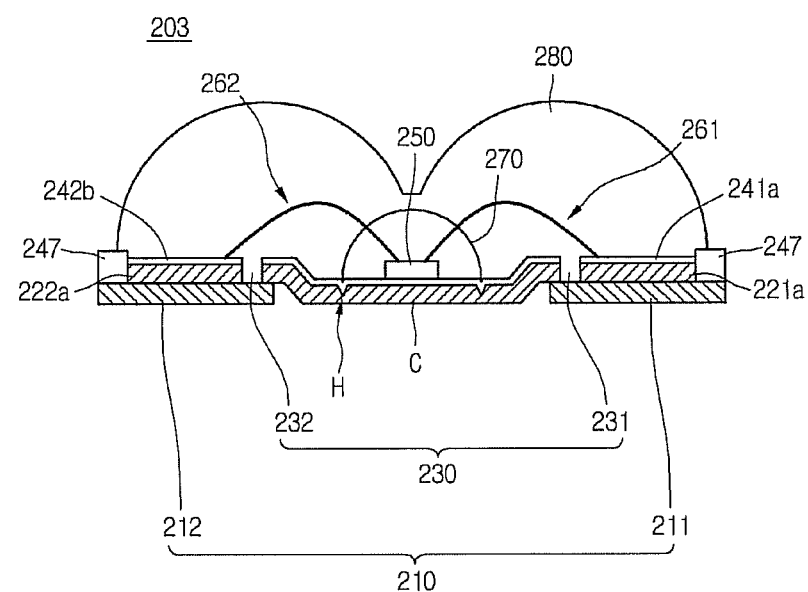
FIG. 4 is a sectional view of a light emitting device package according to a third embodiment.

FIG. 4 is a sectional view of a light emitting device package 203 according to a third embodiment.

The third embodiment may adopt the technical properties of the first and second embodiments.

In the third embodiment, an interface coupling layer 247 may be disposed between the reflective layer 210 and the lens 280.

In the third embodiment, an interface coupling layer 247 may contact the insulation layer pattern 210 disposed thereunder and contact the lens 280 disposed thereon. Thus, the interface coupling layer 247 may improve a coupling force between the lens 280 and the reflective layer 240 to reinforce sealing quality, thereby improving reliability.

In the third embodiment, each of first and second electrode layers 221a and 222a and first and second reflective layers 241a and 241b may have a with less than a horizontal width of the lens 280, but is not limited thereto. Thus, a lower portion of the interface coupling layer 247 may contact the insulation layer pattern 210, and an upper portion of the interface coupling layer 247 may contact the lens 280, but are not limited thereto.

According to embodiments, the reliability may be improved to provide a light emitting device package having improved light efficiency, a backlight unit, and an image display device.

A method of manufacturing a light emitting device package according to embodiments will be described with reference to FIGS. 5 to 14, and also properties of embodiments may be described in more detail. Although FIGS. 5 to 14 illustrate sectional views of a process of manufacturing the light emitting device package according to the first embodiment, embodiments are not limited thereto.

A process of forming an electrode layer 220 including a recess part C will be described with reference to FIGS. 5 to 11.

Figure 5:
FIGS. 5 to 14 are sectional views illustrating a process of manufacturing a light emitting device package according to an embodiment.
Figure 6:
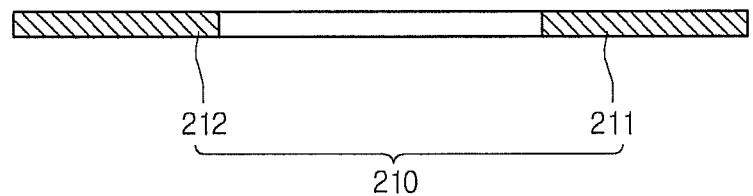

An insulation layer 210 is prepared as shown in FIG. 5, and then an insulation layer pattern 210 is formed as shown in FIG. 6. The insulation layer pattern 210 may be formed using a punching process, but is not limited thereto.

The insulation layer pattern 210 may includes first and second insulation layer patterns 211 and 212 which are respectively attached to lower portions of first and second electrode layers 221 and 222 that will be formed later. The insulation layer pattern 210 may maintain a distance between the two electrode layers 221 and 222 and also support and fix the two electrode layers 221 and 222 adjacent to each other.

Also, the insulation layer pattern 210 may cover an electrode separation part 232 and a symmetrical opening 231 which are disposed between the two electrodes 221 and 222 adjacent to each other. In this case, when a resin layer 270 is formed, the electrode separation part 232 and the symmetrical opening 231 may prevent a liquid resin material from leaking.

The insulation pattern 210 may include a light-transmitting or non-light-transmitting film. For example, the insulation pattern 210 may include a polyimide (PI) film, a polyethylene terephthalate (PET) film, an ethylene vinyl acetate (EVA) film, a polyethylene naphthalate (PEN) film, a triacetyl cellulose (TAC) film, a polyamide imide (PAI) film, a polyether ether ketone (PEEK) film, a perfluoroalkoxy (PFA) film, a polyphenylene sulfide (PPS) film, and resin films (PE, PP, and PET).

The insulation layer pattern 210 may have a thickness of about 70 μm to about 80 μm, but is not limited thereto.

Figure 7:
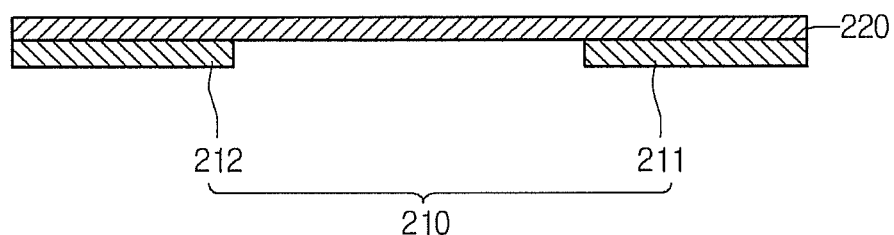

Then, as shown in FIG. 7, the electrode layer 220 is formed on the insulation layer pattern 210. For example, the electrode layer 220 may be formed of Cu, an alloy containing Cu such as Cu—Ni and Cu—Mg—Sn, an ally containing Fe such as Fe—Ni, Al, or an alloy containing Al, but is not limited thereto.

The electrode layer 220 may have a thickness of about 15 μm to about 300 μm. In the current embodiment, the electrode layer 220 may have a thickness of about 15 μm to about 35 μm. Also, the electrode layer 220 may function as a support frame for supporting an LED chip and a heatsink member for conducting heat generated from the LED chip.

Figure 8:
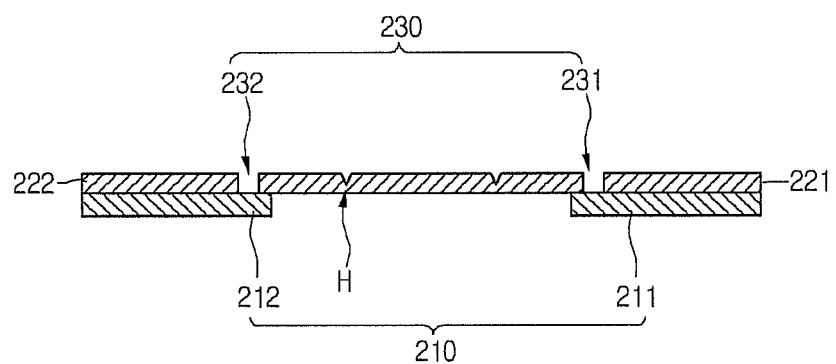

Then, as shown in FIG. 8, a press process or etch process may be performed on the electrode layer 220 to separate the first electrode layer 221 and the second electrode layer 222 from each other.

In the current embodiment, the first electrode layer 221 and the second electrode layer 222 may be electrically separated by an electrode separation part 232. Also, a symmetrical opening 231 may be defined in the first electrode layer 221 at a position symmetrical to that of the electrode separation part 232 with respect to a first recess part C1 that will be formed later to provide stability against a thermal stress and improve light uniformity due to the symmetrical structure of a reflective part. The electrode separation part 232 and the symmetrical opening 231 may be formed by performing an etch process or press process on the electrode layer.

Also, in the current embodiment, a groove H may be formed in the first electrode layer 221 corresponding to an outer circumference of a resin layer that will be described later to form a resin layer 270 including a phosphor in a dome shape, thereby reducing a color variation.

The groove H formed in the first electrode layer 221 may be formed by half etching without passing through the first electrode layer 221, but is not limited thereto. In the current embodiment, the groove H formed in the first electrode layer 221 by the half etching may have a with of about 20 μm and a height of about 12 μm, but are not limited thereto.

Figure 9:
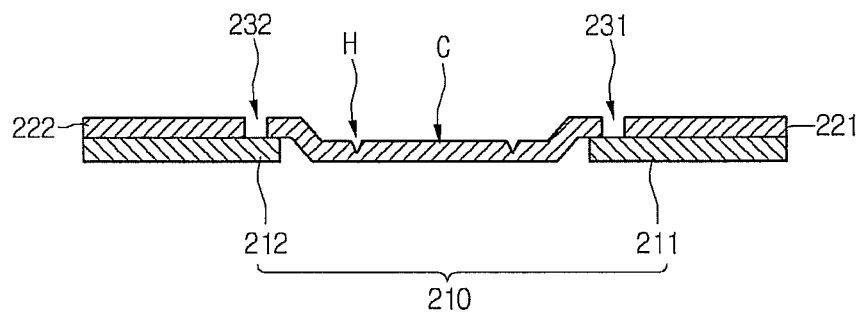

Referring to FIG. 9, a process of forming a recess part c on the electrode layer 220 is performed.

For example, the recess part C may be formed on the first electrode layer 221. A down-set process or punching process may be performed on a portion of the first electrode layer 221 to form the recess part C, but is not limited thereto.

According to the current embodiment, the down-set process may be performed on the electrode layer 220 to form the recess part C, and then the LED 25 chip may be mounted on the recess part C to improve structural stability.

Also, according to the current embodiment, after the recess part C is formed on the electrode layer 220, the LED chip 250 may be mounted on the recess part C and the resin layer 270 including the phosphor may be formed. Thus, when an encapsulation including the phosphor is formed, the encapsulation may be formed in a doom shape to produce a uniform color temperature, thereby improving the color variation.

Figure 10:
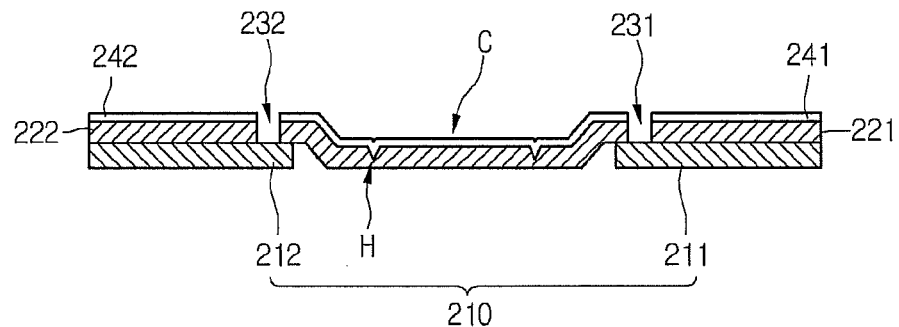

Then, as illustrated in FIG. 10, a reflective layer 240 may be formed on the electrode layer 220. The reflective layer 240 may include a first reflective layer 241 on the first electrode layer 221 and a second reflective layer 242 on the second electrode layer 222.

The reflective layer 240 may be formed of silver (Ag), Nickel (Ni), aluminum (Al), or an alloy thereof, but is not limited thereto.

Figure 11:
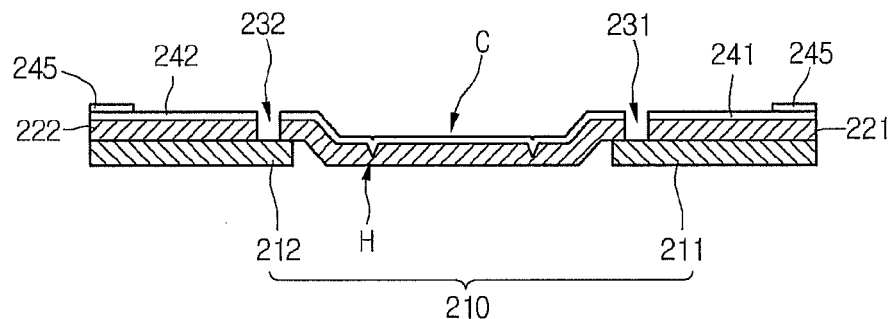

Then, as illustrated in FIG. 11, an interface coupling layer 245 may be formed outside the reflective layer 240.

For example, as shown in FIG. 1, in the first embodiment, the interface coupling layer 245 may be disposed between the reflective layer 240 and the lens 280. For example, the interface coupling layer 245 may be formed on the outer circumference of the electrode layer 240. Also, an inner surface of the interface coupling layer 245 may have a circular shape corresponding to that of the lens 280, but is not limited thereto. The interface coupling layer 245 may be formed under an outer circumference of the lens 280.

According to the first embodiment, the interface coupling layer 245 may be disposed between the reflective layer 240 and the lens 280 to increase a coupling force between the lens 280 and the reflective layer 240. Thus, sealing quality on a side portion of the lens 280 may be reinforced to prevent moisture from being penetrated and the electrode layer 220 or a die adhesive from fading, thereby increasing light efficiency. Therefore, a light emitting device package having improved reliability, a backlight unit, and an image display device may be provided.

Also, according to embodiments, the interface coupling layer 245 disposed under the outer circumference of the lens 280 may prevent the lens 280 from being deformed by the thermal stress to prevent the lens 280 from being delaminated and reinforce the sealing quality against the moisture penetration. Thus, a light emitting device package having improved reliability, a backlight unit, and an image display device may be provided.

For example, as shown in FIG. 3, in the second embodiment, the interface coupling layer 246 may be formed between the reflective layer 240 and the lens 280 and side surfaces of the reflective layer 240 and the insulation layer pattern 210.

According to the second embodiment, the interface coupling layer 246 may be formed between the reflective layer 240 and the lens 280 and the side surfaces of the reflective layer 240 and the insulation layer pattern 210 to intercept a moisture penetration path of a side surface of the outer circumference of the lens 280 and increase a coupling force between the lens 280 and the reflective layer 240. Thus, sealing quality on a side portion of the lens 280 may be reinforced to prevent moisture from being penetrated, thereby increasing light efficiency. Therefore, a light emitting device package having improved reliability, a backlight unit, and an image display device may be provided.

Also, according to embodiments, the interface coupling layer 246 may be formed between the reflective layer 240 and the lens 280 and the side surfaces of the reflective layer 240 and the insulation layer pattern 210 to prevent the lens 280 from being delaminated and reinforce sealing quality against the moisture penetration. Thus, a light emitting device package having improved reliability, a backlight unit, and an image display device may be provided.

For example, as shown in FIG. 4, in the third embodiment, the interface coupling layer 247 may be disposed between the reflective layer 210 and the lens 280.

In the third embodiment, an interface coupling layer 247 may contact the insulation layer pattern 210 disposed thereunder and contact the lens 280 disposed thereon. Thus, the interface coupling layer 247 may improve a coupling force between the lens 280 and the reflective layer 240 to reinforce sealing quality, thereby improving reliability.

In the third embodiment, each of the first and second electrode layers 221a and 222a and the first and second reflective layers 241a and 241b may have a with less than a horizontal width of the lens 280, but is not limited thereto.

Thus, according to embodiments, since the reliability may be improved, a light emitting device having improved light efficiency, a backlight unit, and an image display device may be provided.

Figure 12:
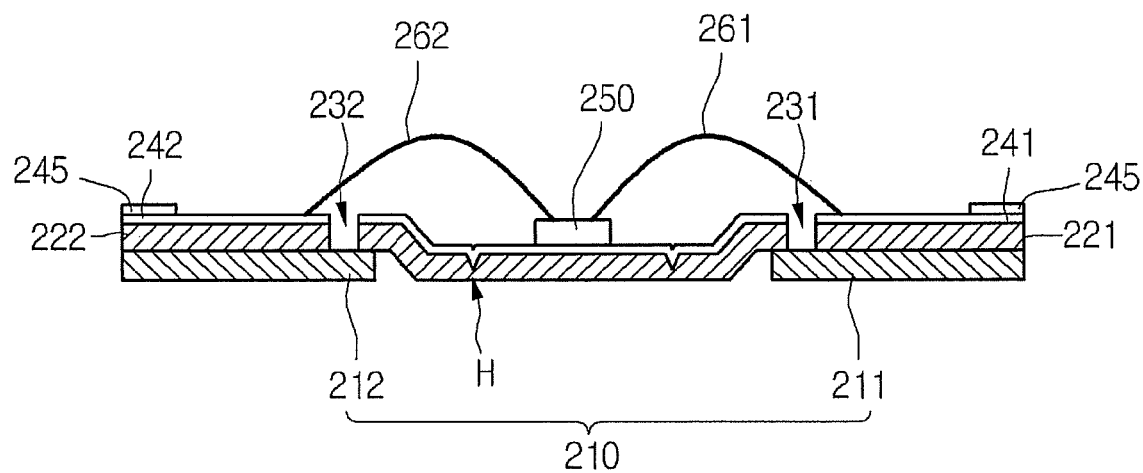

Referring to FIG. 12, the LED chip 250 is mounted on the recess part C of the first electrode layer 221. For example, the LED chip 250 may be mounted after a die adhesive (not shown) such as silicon epoxy is formed on a mounting area of the recess part C.

Thereafter, the LED chip 250 may be electrically connected to the first electrode layer 221 by a first wire 261 and electrically connected to the second electrode layer 222 by a second wire 262.

According to the current embodiment, since the LED chip 250 is mounted after the recess part C is formed on the electrode layer 220, a position on which the LED chip 250 is seated may be lowered to reduce a height of a wire when a wire bonding process is performed. Thus, a thermal stress may be minimized to improve a yellow ring phenomenon due to the thermal stress.

Figure 13:
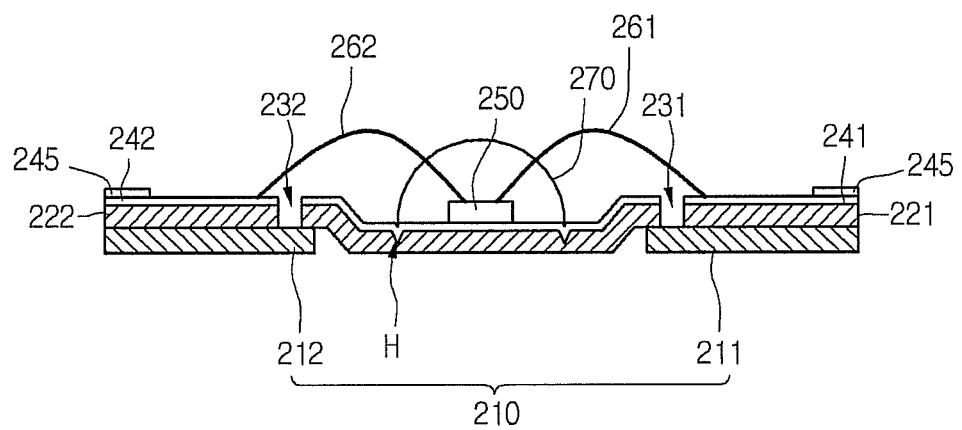

Referring to FIG. 13, the resin layer 270 including the phosphor may be formed on the LED chip 250 mounted on the recess part C of the first electrode layer 221.

Also, according to the current embodiment, after the recess part C is formed on the electrode layer 220, the LED chip 250 may be mounted on the recess part C and the resin layer 270 including the phosphor may be formed. Thus, when an encapsulation including the phosphor is formed, the encapsulation may be formed in a doom shape to produce a uniform color temperature, thereby improving the color variation.

For example, according to the current embodiment, the phosphor may be dotted on the LED chip 250 to reduce an area of the phosphor when compared to an existing method in which a phosphor is filled into a cup. Thus, the color vibration may be reduced to reduce an occurrence of irregular colors and also to reduce a thickness of a set.

Figure 14:
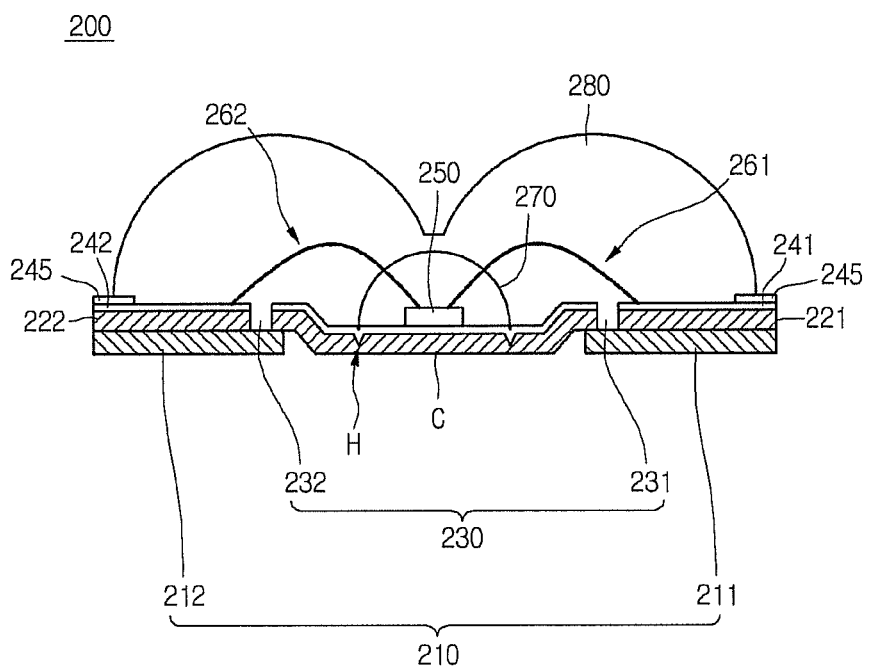

Then, as shown in FIG. 14, the lens 280 may be formed on the resin layer 270 and the electrode layer 220.

In the current embodiment, the lens 280 may have a concave central portion and a circular peripheral portion. The lens 280 may be formed of a material having physical properties similar to those of the material of the resin layer 270 to minimize a thermal expansion stress due to the thermal stress. For example, the lens 280 may be formed of a material such as silicone, but is not limited thereto.

According to embodiments, the reliability may be improved to provide a light emitting device package having improved light efficiency, a backlight unit, and an image display device.

Figure 15:
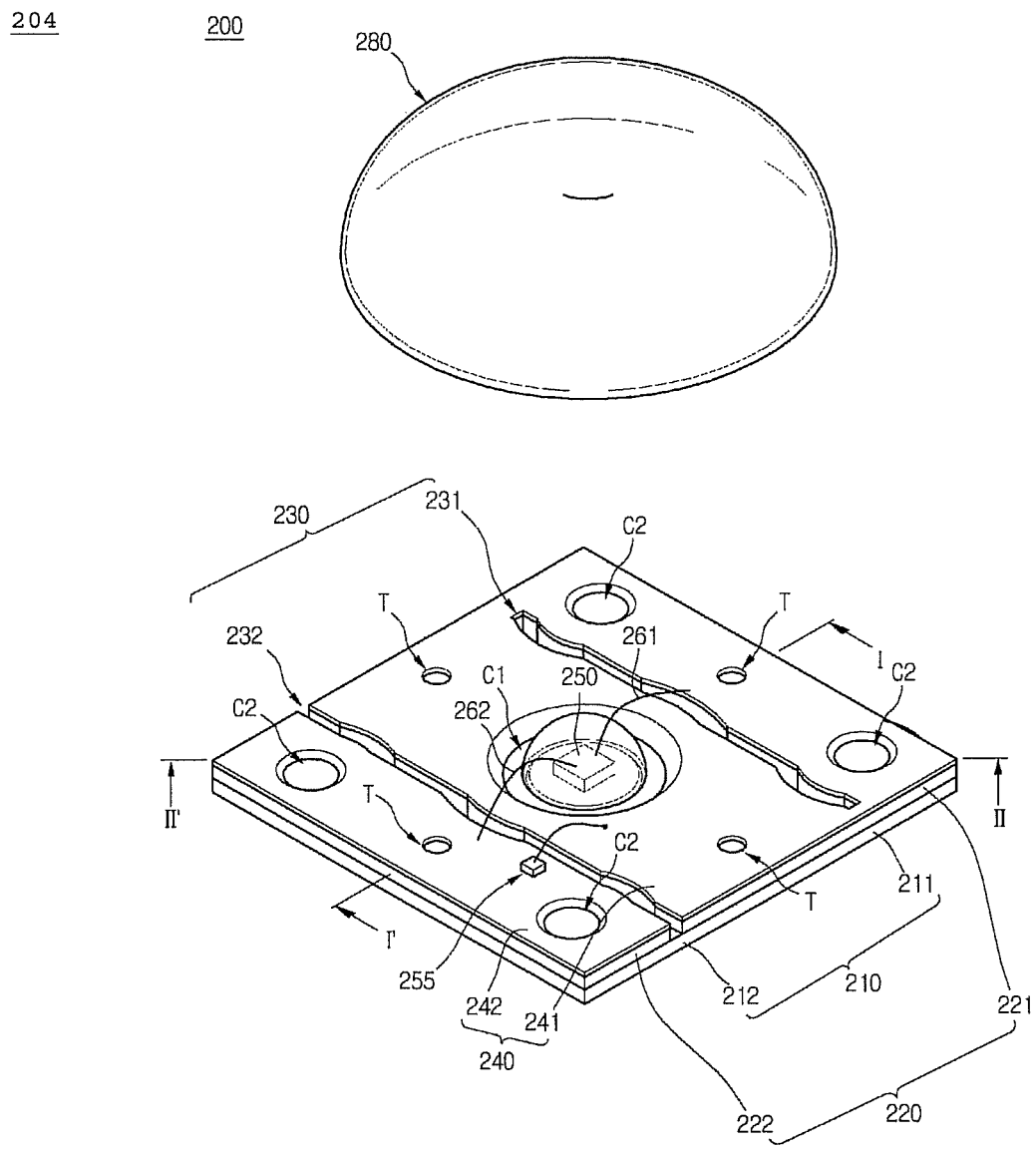
FIG. 15 is an exploded perspective view of a light emitting device package according to a fourth embodiment.

FIG. 15 is an exploded perspective view of a light emitting device package 204 according to a fourth embodiment.

Figure 16:
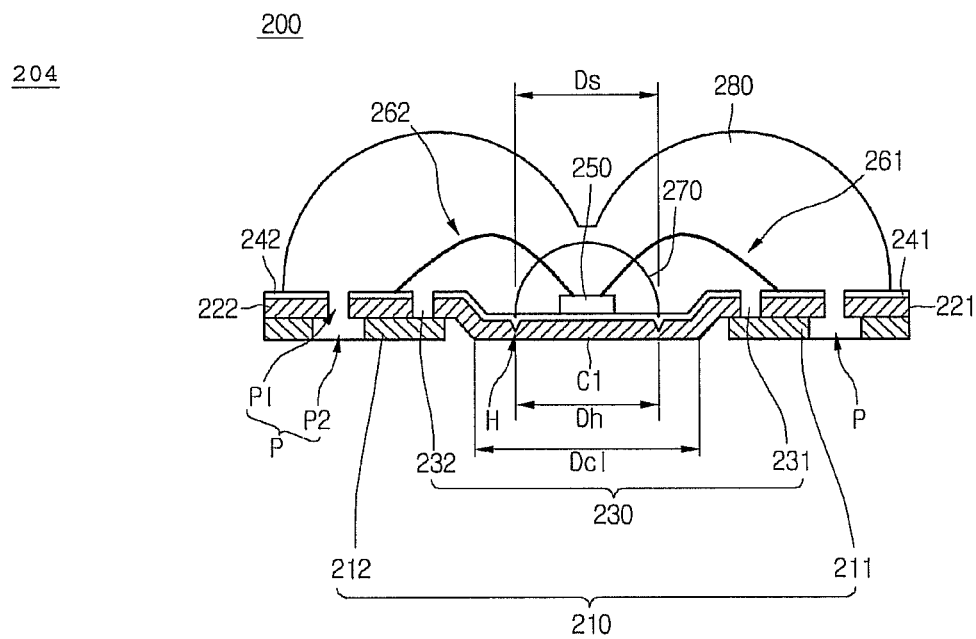
FIG. 16 is a first sectional view of the light emitting device package according to the fourth embodiment.
Figure 17:
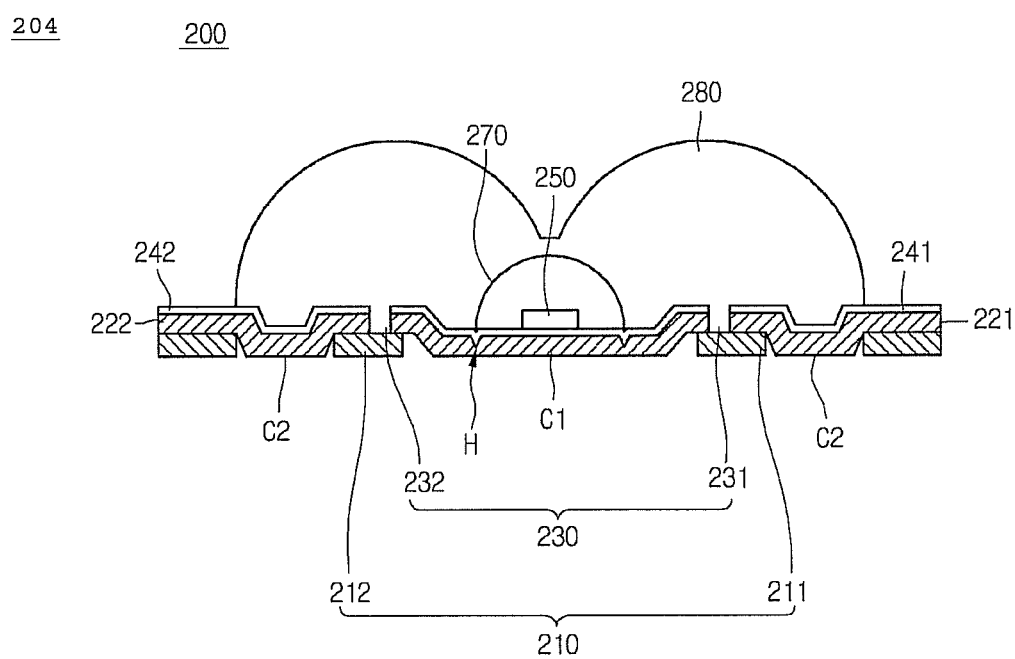
FIG. 17 is a second sectional view of the light emitting device package according to the fourth embodiment.

FIG. 16 is a first sectional view of the light emitting device package 204 according to the fourth embodiment. FIG. 17 is a second sectional view of the light emitting device package 204 according to the fourth embodiment.

For example, FIG. 16 is a sectional view taken along the line I-I' of FIG. 15. FIG. 17 is a sectional view taken along line II-II' of FIG. 15.

The light emitting device package according to the fourth embodiment may adopt technical properties of the light emitting device according to the first to third embodiments. In the fourth embodiment, the recess part C according to the first to third embodiments may be called a first recess part C1.

The light emitting device package 204 according to the fourth embodiment may include an electrode layer 220 including a first electrode layer 221 and a second electrode layer 222, a first recess part C1 defined in a portion of the first electrode layer 221, a light emitting device 250 disposed on the first recess part C1, an electrode separation part 232 electrically separating the first and second electrode layers 221 and 222 from each other, a resin layer 270 including a wavelength conversion material on the light emitting device 250, a lens 280 above the resin layer 270 and the electrode layer 220, an insulation layer pattern 210 disposed under the electrode layer 220, a hole T passing through the electrode layer 220 and the insulation layer pattern 210, and a protrusion P extending from a lower portion of the lens 280. The wavelength conversion material may include a phosphor.

Also, in the current embodiment, since a groove H is defined in the first recess part C1 of the first electrode layer 221 on an outer circumference of the resin layer 270, the resin layer 270 may be manufactured in a dome shape to reduce a color vibration. Here, the phosphor may be coated in a flat shape, but a doom shape, through a conformal coating process. The groove H may have a diameter Dh less than that Dc1 of the first recess part C1 and greater than that Ds of the resin layer 270. The groove H may have a diameter Dh of about 750 μm to about 850 μm, but is not limited thereto.

Also, in the current embodiment, each of the first and second electrode layers 221 and 222 may include a second recess part C2.

The second recess part C2 may be a second down-set area or second bent part area disposed on an edge of the first and second electrode layers 221 and 222, but is not limited thereto. For example, the second recess part C2 may be a second down-set area disposed on an edge or side surface with respect to the electrode layer 220.

At least one portion of the second recess part C2 may vertically overlap the lens 280. For example, since the second recess part C2 may contact an outer circumference of the lens 280, the second recess part C2 disposed under the outer circumference of the lens 280 may prevent the lens 280 from being deformed by a thermal stress to prevent the lens 280 from being delaminated and reinforce sealing quality against the moisture penetration. Thus, a light emitting device package having improved reliability, a backlight unit, and an image display device may be provided.

Also, in the current embodiment, the lens 280 may vertically overlap the second recess part C2. Thus, structural stability may be improved by the second recess part C2.

Alternatively, the lens 280 may not vertically overlap the second recess part C2.

Also, according to the current embodiment, the second recess part C2 may serve as an electrode. For example, as shown in FIG. 3, portions of the first and second electrode layers 221 and 222 may be exposed through a bottom surface of the second recess part C2. Thus, an external power may be supplied through the first and second electrode layers 221 and 222 exposed through the bottom surface of the second recess part C2.

In the current embodiment, the first electrode layer 221 and the second electrode layer 222 may be electrically separated from each other by the electrode separation part 232. Also, a symmetrical opening 231 having a shape equal or similar to that of the electrode separation part 232 may be defined in the first electrode layer 221 at a position symmetrical to that of the electrode separation part 232 with respect to the first recess part C1 to provide stability against the thermal stress and solve light uniformity limitation due to an asymmetrical structure on a reflective surface. The electrode separation part 232 and the symmetrical opening 231 may constitute a separation part 230.

According to a related art, an electrode layer may be electrically separated by an electrode separation wire to prevent the electrode layer from being electrically short-circuited. Thus, the electrode separation wire may be vulnerable to moisture introduction to deteriorate sealing quality, thereby reducing reliability.

In the current embodiment, to improve the sealing quality, an electrode layer 220 for fixing the silicon lens may be provided. For example, the hole T passing through the electrode layer 220 and the insulation layer pattern 210 may be defined, and the protrusion P extending from the lower portion of the lens 80 may be disposed in the hole T to prevent the lens 80 from coming off.

For example, the protrusion P may be formed of the same material as the lens 280. Thus, a lens material may be filled into the hole T to form the protrusion P, and thus the protrusion P may prevent the lens 280 from coming off.

In the current embodiment, the protrusion P may have a stepped portion to serve as a fixing part for the lens 280, thereby prevent the lens 280 from coming off.

For example, the protrusion P may have a lower horizontal width greater than an upper horizontal width to prevent the lens 280 from coming off.

Also, in the current embodiment, the electrode separation part 232 may have a curved shape to lengthen a moisture penetration path, thereby reinforcing sealing quality and improving reliability.

For example, as shown in FIG. 1, in the light emitting device package according to the embodiment, the electrode separation part 232 or the symmetrical opening 231 may have a curved shape at a position closing to the first recess part C1 to lengthen the moisture penetration path, thereby reinforcing the sealing quality and improving the reliability.

According to the current embodiment, the electrode separation part 232 or the symmetrical opening 231 may have a curved shape at a position closing to the second recess part C2 to lengthen the moisture penetration path, thereby reinforcing the sealing quality and improving the reliability.

According to the current embodiment, the electrode separation part 232 or the symmetrical opening 231 may have curved shapes at positions closing to the first and second recess parts C1 and C2 to lengthen the moisture penetration path, thereby reinforcing the sealing quality and improving the reliability.

According to the current embodiment, the electrode separation part 232 and/or the symmetrical opening 231 may have curved shapes at position(s) closing to the first and second recess parts C1 and/or C2, and remaining portions may have straight line shapes, but are not limited thereto.

According to the current embodiment, the electrode separation part 232 or the symmetrical opening 231 may have curved shapes at position(s) closing to the first and second recess parts C1 and/or C2, and remaining portions may have irregularly curved shapes (not shown) to lengthen the moisture penetration path, thereby reinforcing the sealing quality and improving the reliability.

In the current embodiment, the first recess part C1 may be disposed at a central portion of the electrode layer 220 between the electrode separation part 232 and the symmetrical opening 231. Also, the second recess part C2 may be disposed on an edge of the electrode layer 220 outside the electrode separation part 232 and the symmetrical opening 231.

Although the two second recess parts C2 may be provided on the edge of the first electrode layer 221 and the two second recess parts C2 may be provided on the edge of the second electrode layer 222 in the current embodiment, the present disclosure is not limited thereto. For example, only one second recess part C2 may be provided on each of the edges of the first and second electrode layers 221 and 222.

According to the current embodiment, the reliability may be improved to provide a light emitting device package having improved light efficiency, a backlight unit, and an image display device.

Figure 18:
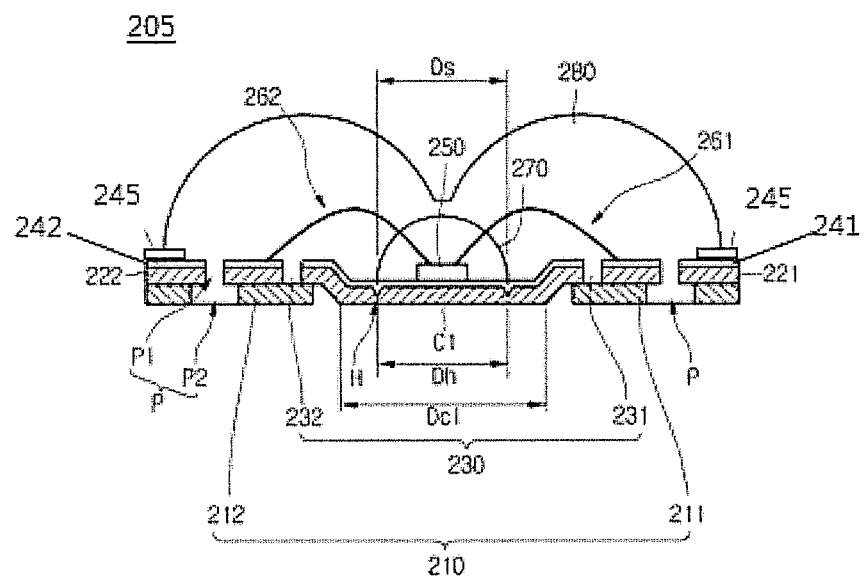
FIG. 18 is a sectional view of a light emitting device package according to a fifth embodiment.

FIG. 18 is a sectional view of a light emitting device package 205 according to a fifth embodiment.

The light emitting device 205 according to the fifth embodiment may adopt technical properties of the light emitting device 204 according to the fourth embodiment.

In the fifth embodiment, an interface coupling layer 245 may be disposed between the reflective layer 240 and the lens 280 to increase a coupling force between the lens 280 and the reflective layer 240. Thus, sealing quality on a side portion of the lens 280 may be reinforced to prevent moisture from being penetrated and the electrode layer 220 or a die adhesive from fading, thereby increasing light efficiency. Therefore, a light emitting device package having improved reliability, a backlight unit, and an image display device may be provided.

Also, according to the current embodiment, the interface coupling layer 245 disposed under the outer circumference of the lens 280 may prevent the lens 280 from being deformed by the thermal stress to prevent the lens 280 from being delaminated and reinforce the sealing quality against the moisture penetration. Thus, a light emitting device package having improved reliability, a backlight unit, and an image display device may be provided.

In the fifth embodiment, the interface coupling layer 245 may adopt the technical properties of those according to the first to third embodiments.

Also, the interface coupling layer 245 may be disposed between the electrode layer 220 and the lens 280, like the first embodiment.

Also, the interface coupling layer 245 may be disposed between the reflective layer 240 and the lens 280 and side surfaces of the reflective layer 240 and the insulation layer pattern 210, like the second embodiment.

Also, the interface coupling layer 245 may be disposed between the insulation layer pattern 210 and the lens 280, like the third embodiment.

According to the current embodiment, the reliability may be improved to provide a light emitting device package having improved light efficiency, a backlight unit, and an image display device.

Figure 19:
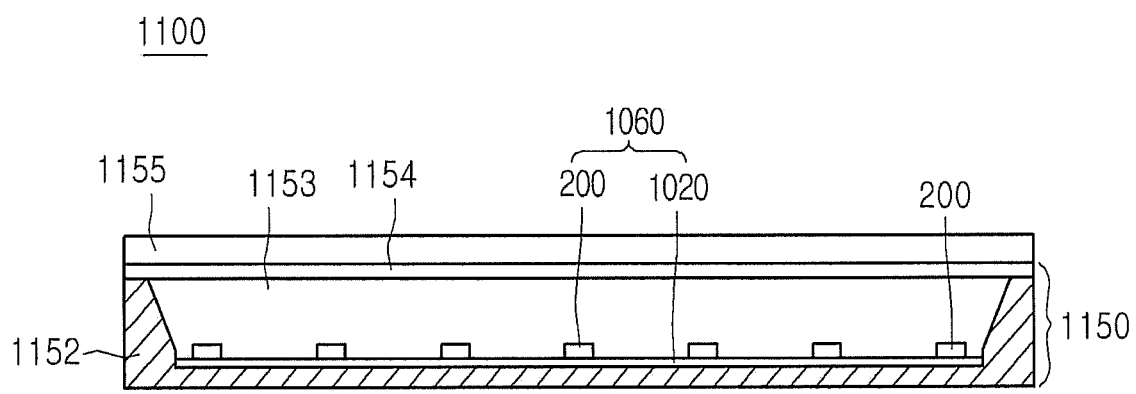
FIG. 19 is a perspective view of a backlight unit and an image display device including the backlight unit according to an embodiment.

FIG. 19 is a view of a display device 1100 according to an embodiment.

Referring to FIG. 19, a display apparatus 1100 includes a bottom cover 1152, a board 1020 on which the light emitting device packages 200 described above are arrayed, an optical member 1154, and a display panel 1155. A light emitting device package 292 according to another embodiment may be applied to the light emitting device package 200.

The board 1020 and the light emitting device package 200 may be defined as a light emitting module 1060. The bottom cover 1152, at least one light emitting module 1060, the optical member 1154 may be defined as the light unit.

The bottom cover 1152 may include a receiving part 1153, but is not limited thereto.

Here, the optical member 1154 may include at least one of a lens, a light guide plate, a diffusion sheet, horizontal and vertical prism sheets, and a bright enhancement sheet. The light guide plate may be formed of a PC material or poly methy methacrylate (PMMA) material. In this case, the light guide plate may be removed. The diffusion sheet diffuses incident light, and the horizontal and vertical prism sheets collect the incident light into the display area. Also, the brightness enhanced sheet reuses lost light to improve brightness.

The optical member 1154 is disposed on the light emitting module 1060 to produce planar light using the light emitted from the light emitting module 1060 or diffuse and collect the light emitted from the light emitting module 1060.

According to the current embodiment, a light emitting device package having improved color variation, a backlight unit, and an image display device may be provided.

For example, according to the current embodiment, the phosphor may be dotted on the LED chip to reduce an area of the phosphor when compared to an existing method in which a phosphor is filled into a cup. Thus, the color vibration may be reduced to reduce an occurrence of irregular colors and also to reduce a thickness of a set.

According to the current embodiment, the reliability may be improved to provide a light emitting device package having improved light efficiency, a backlight unit, and an image display device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
    an electrode layer that includes first and second electrode layers spaced from each other;
    a recess provided on the first electrode layer;
    a light emitting device provided in the recess over the first electrode layer;
    a reflective layer that includes first and second reflector layers provided over the electrode layer;
    a resin layer provided over the light emitting device in the recess;
    an interface coupling layer that includes first and second interface coupling layers provided over an upper surface of the reflective layer;
    a lens provided over the interface coupling layer to cover the resin layer; and
    an insulation layer pattern provided under the electrode layer,
    wherein the interface coupling layer is provided between the electrode layer and the lens,
    wherein the lens is provided on an upper surface of the interface coupling layer such that the interface coupling layer laterally extends beyond an inner surface area of the interface coupling layer covered by the lens,
    wherein a gap is provided between the first and second electrode layers for electrically separating the first and second electrode layers from each other, the gap extending along a width of the first and second electrode layers and beyond the inner surface area of the interface coupling layer covered by the lens, and
    wherein an opening is formed on the first electrode layer, the opening provided parallel to the gap and having a length less than a length of the gap and in a plan view the opening having a prescribed shape corresponding to a shape of the gap and defined in a position symmetrical to that of the gap within the inner surface area of the interface coupling layer covered by the lens and the insulation layer pattern is exposed through the gap and the opening.

2. The light emitting device package according to claim 1, wherein the interface coupling layer comprises a solder resist.

3. The light emitting device package according to claim 1, wherein the recess of the first electrode layer is a down-set area with respect to a portion of the first electrode layer.

4. The light emitting device package according to claim 1, wherein the resin layer comprises a phosphor and has a dome or flat shape.

5. The light emitting device package according to claim 1, wherein the interface coupling layer is disposed under an outer circumference of the lens.

6. The light emitting device package according to claim 5, wherein the outer circumference of the lens overlaps with the interface coupling layer.

7. The light emitting device package according to claim 1, wherein the recess of the first electrode layer is a bent part area with respect to a portion of the first electrode layer.

8. The light emitting device package according to claim 1, wherein an inner profile of the interface coupling layer has a circular shape corresponding to that of the lens.

9. The light emitting device package according to claim 1, wherein a bottom surface of the insulating layer pattern is coplanar with a bottom surface of the first electrode layer corresponding to the recess.

10. The light emitting device package according to claim 1, wherein the resin layer has a dome shape having a prescribed width that is less than a width of a bottom surface of the recess.

11. The light emitting device package according to claim 10, wherein a groove is formed within the recess and the resin layer is provided over the groove such that an outer edge of the resin layer is positioned at the groove.

* * * * *